United States Patent [19]

Higashino et al.

[11] Patent Number: 4,609,831

[45] Date of Patent: Sep. 2, 1986

[54] APPARATUS FOR TRANSMITTING ENERGY TO AND FROM COILS

[75] Inventors: Shigenori Higashino; Yoshiro Shikano; Kanji Katsuki, all of Hyogo, Japan

[73] Assignee: Mitsubishi Denki K.K., Tokyo, Japan

[21] Appl. No.: 473,408

[22] Filed: Mar. 9, 1983

[30] Foreign Application Priority Data

Mar. 9, 1982 [JP] Japan ................................ 57-38913

[51] Int. Cl.[4] ........................ H03K 3/38; H03K 17/12

[52] U.S. Cl. .................................... 307/270; 307/277; 307/246; 307/252 C; 307/252 K; 307/282; 307/306

[58] Field of Search ............... 307/268, 270, 318, 319, 307/320, 317 R, 246, 252 C, 252 J, 252 K, 252 Q, 282, 314, 306, 277; 328/65, 67

[56] References Cited

PUBLICATIONS

Kustom, Robert L., "Comparison of Flying Capacitor Bridge Circuits and Inductor-Convertor Bridge Circuits for the Transfer of Energy Between Superconducting Coils," Superconductive Energy Storage, Oct. 10, 1979.

Ueda, K., et al, "Energy Transfer Experiment with Flying Capacitor Circuit," Superconductive Energy Storage, Oct. 10, 1979.

Fuja, Raymond E., et al, "Three-Phase Energy Transfer Circuit with Superconducting Energy Storage Coils," 1980 IEEE.

*Primary Examiner*—John S. Heyman

*Attorney, Agent, or Firm*—Sughrue, Mion, Zinn Macpeak & Seas

[57] ABSTRACT

An apparatus for transmitting energy to and from superconductive coils, via a unipolar capacitor having a large capacitance. The apparatus is characterized by the use of two on-off self-controllable switches which are turned on and off under instructions from a control circuit or the like. The control circuits assure that the capacitor voltage remains constant by operating the switches in response to detected voltage levels.

5 Claims, 13 Drawing Figures

APPARATUS FOR TRANSMITTING ENERGY TO AND FROM COILS

BACKGROUND OF THE INVENTION

This invention relates to an apparatus for transmitting energy to and from superconductive coils, or for transmitting the energy stored in one coil to another coil through a capacitor.

FIG. 1 illustrates a conventional apparatus of this type as disclosed in Ueda et al, "Energy Transfer Experiment With Flying Capacitor Circuit" *Superconductor Energy Storage* Oct. 10, 1979 (p118–121). In FIG. 1, the apparatus comprises a capacitor 1 for transmitting energy, an energy releasing coil 31, an energy absorbing superconductive coil 41, and thyristor elements 11–14.

The operation of this apparatus follows a method of transmitting energy wherein, after transmitting the energy stored in the coil 31 to the capacitor 1 little by little, the energy from the capacitor 1 is transmitted to the coil 41. FIG. 3 indicates this transmission order. The sequential operation 1–4 shown in FIG. 3 constitute one cycle, whereas FIGS. 2(*a*)–(*c*) show the voltage changes in the capacitor 1 and coils 31, 41 in an operating section between operations 1–4. FIG. 2 illustrates the voltage Vc across the terminals of the capacitor 1, the voltage V1 across the terminals of the coil 31, and the voltage V2 across the terminals of the coil 41.

In FIG. 1, because the on and off states of the thyristors 11–14 are established according to the voltage polarity of the capacitor 1, the voltage polarity of the capacitor 1 is always inverted at the point of time of the termination of the operation 3 shown in FIG. 3. Moreover, because the terminal voltage of the capacitor 1 is provided with a polarity such as is incapable of biasing the thyristor 12 in the reverse direction, the thyristor 12 may not be voluntarily turned on and this makes quick-response control impossible.

The quantity of energy that can be transmitted per unit time when the currents in the superconductive coils are equal is given by $$E \approx \frac{1}{2\Delta T}\int_0^{\Delta T}\left(\frac{Vc_{Max}}{\Delta T}\cdot t \times I_1\right)dt = \tfrac{1}{4} \times I_1 \times Vc_{Max}$$

where $I_1$ = current of the coil 31, $\Delta T$ = the maximum on time of the thyristor 13 and $Vc_{Max}$ = the maximum voltage of the capacitor 1.

The conventional apparatus thus constructed has the following disadvantages:

(a) The apparatus requires a bipolar capacitor for transmitting purposes.

(b) The capacitance value of the capacitor cannot be made greater from the standpoint of the relation between the inductance value of the coil and the energy transmitting speed.

(c) The apparatus is lacking in rapid-response controllability because the time factor makes control impossible in view of circuit operation.

(d) Since the terminal voltage applied to the energy transmitting coil is in the shape of a ramp, the quantity of energy that can be transmitted is small in comparison with the maximum value of the coil voltage.

SUMMARY OF THE INVENTION

The present invention has been made to eliminate the drawbacks of the prior art; and an object of the invention is to provide an apparatus for transmitting energy which reduces the time wasted on control by means of superconductive an on-off self-controllable switch which is turned on and off under instructions from a control circuit; making it possible to employ an inexpensive unipolar capacitor of a large capacitance by controlling the capacitor voltage to make it constant; and causing the apparatus to transmit a large quantity of energy in comparison with the maximum value of the coil voltage, as the voltage applied to a coil is allowed to have a square waveform.

The expression "on-off self-controllable switch" means a switch which is capable of interrupting a D.C. current. An example of such a switch is a chopper circuit which is composed of a transistor, a gate-turn-off thyristor (GTO), a thyristor and the like.

Moreover, by controlling the capacitor voltage so as to make it constant, the apparatus makes it readily possible to control the transmission of energy between a number of coils through a common capacitor.

DETAILED DESCRIPTION OF THE PREFERRED EMBODIMENTS

Figure 4:
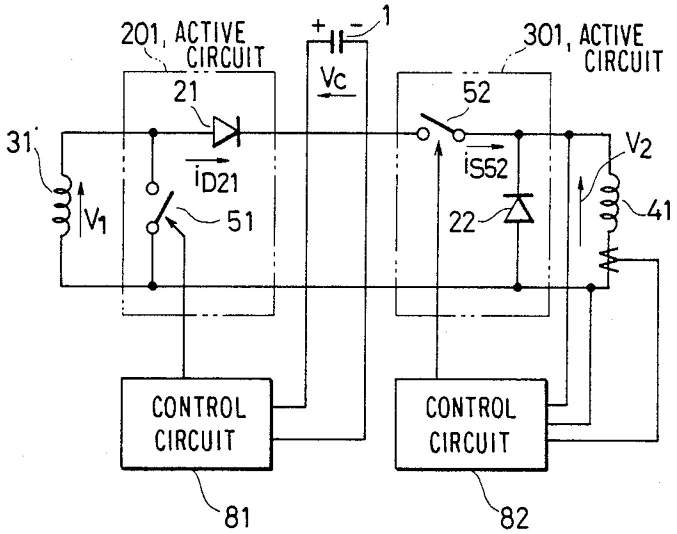
FIG. 4 is a circuit configuration illustrating an energy transmitting apparatus according to one example of the present invention.

Referring now to the drawings, an example of the present invention will be described. FIG. 4 illustrates a capacitor 1 for transmitting energy, a superconductive coil 31 for releasing energy, a superconductive coil 41 for absorbing energy, an on-off self-controllable switch 51 connected to the energy releasing coil 31 in parallel, a diode 22 connected to the energy absorbing coil 41 in parallel, a diode 21 connecting one end of the coil 31 to a first end of the capacitor 1 and an on-off self-controllable switch 52 connecting one end of the energy absorbing coil 41 to the above-noted end of the capacitor 1, the other end of the capacitor 1 being connected to the diode 22, the coil 31 to which the switch 52 has not been connected, and the terminal of the coil 41.

The diode 21 and switch 51 constitute an active circuit 201 for an energy releasing circuit controlling the product of time and current flowing into the capacitor 1 from the energy releasing coil 31, and the on and off states of the switch 51 are controlled by a control circuit 81 so as to maintain the terminal voltage of the capacitor 1 constant.

The diode 22 and switch 52 constitute an active circuit 301 for an energy absorbing circuit, and the on and off states of the switch 52 are controlled by a control circuit 82 in order to regulate the voltage applied to the energy absorbing coil 41.

Figure 5:
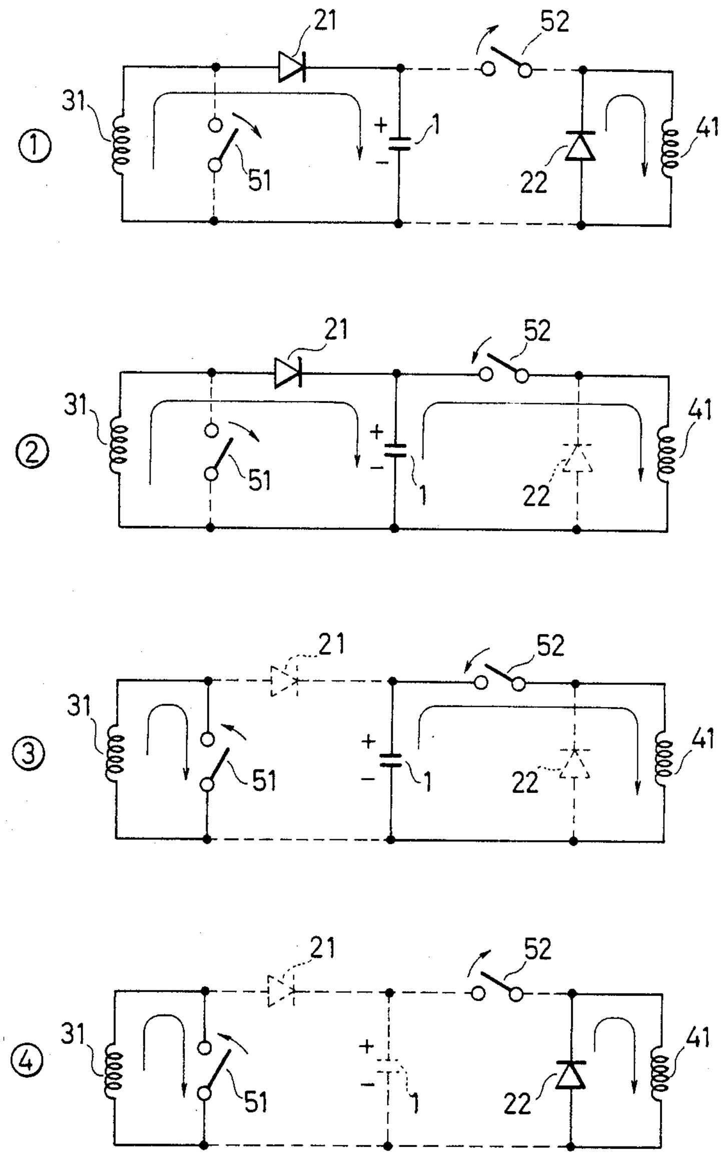
FIGS. 5(1)–(4) are diagrams of operating modes explanatory of the operation of the FIG. 4 device.

The operation of this example of the present invention will now be described. The method of transmitting energy employed in this example is such that the energy of the coil 31 is transmitted to the coil 41 through the capacitor 1. However, the capacitor 1 is used at a constant voltage Vc including a minute voltage ripple. FIGS. 5(1)-(4) show workable operating modes, whereas FIGS. 6(*a*)-(*e*) indicate examples of the changes of the voltages and currents in the components in operation, where Vc=voltage between the terminals of the capacitor 1, $iD_{21}$=the waveform of the current drawn by the diode 21, V1=voltage between the terminals of the coil 31, $iS_{52}$=the waveform of the current drawn by the switch 52, and $V_2$=the terminal voltage of the coil 41.

In FIG. 4, the switch 51 is controlled in a manner such that it is turned on and off under instructions from the control circuit 81 at preset time intervals Δt to maintain the voltage Vc of the capacitor 1 constant.

Moreover, the switch 52 is controlled in a manner such that it is turned on and off under instructions from the control circuit 82 at preset time intervals Δt to obtain from the capacitor 1 that energy which should be transmitted to the coil 41.

The aforementioned parameters Δt, Vc can be determined by the quantity of energy to be transmitted per unit time, the quantity of an allowable ripple in the capacitor voltage and the quantity of allowable ripple in the coils 31, 41. The greater Vc is set, the greater the energy quantity that can be transmitted per unit time interval.

In addition, the maximum energy quantity transmittable per unit time interval when the currents in the coils 31, 41 are equal becomes $$E \cong \frac{1}{\Delta T}\int_{0}^{\Delta T} (Vc_{Max} \times I_1)\, dt = I_1 \times Vc_{Max}$$

where $I_1$=current in the coil 31, ΔT=the maximum on time of the switch, and $Vc_{Max}$=the maximum voltage of the capacitor 1.

Figure 6:
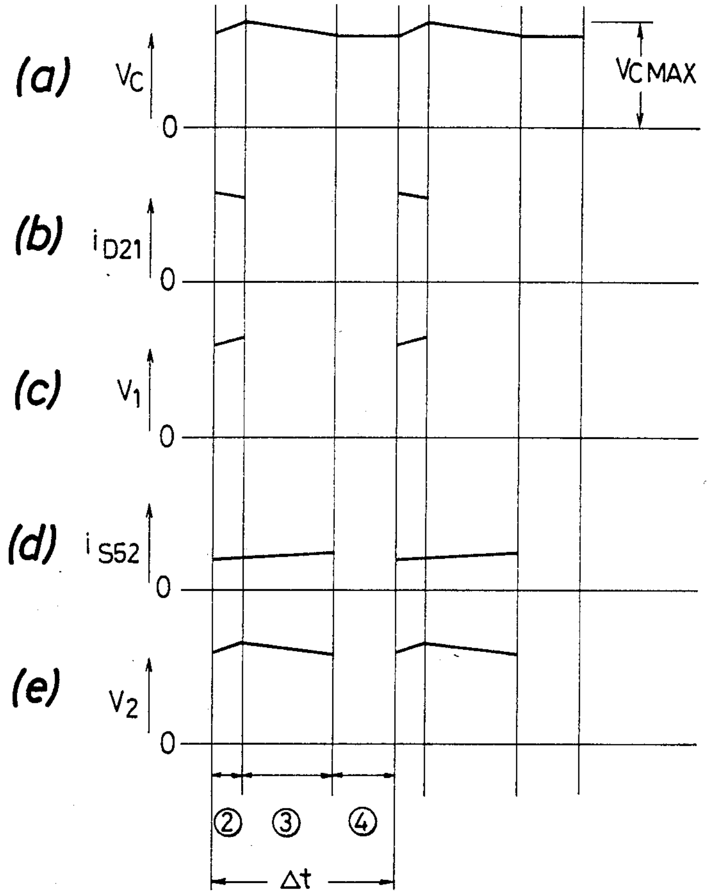
FIGS. 6(*a*)–(*c*) are waveform charts illustrating the changes in voltages or currents at various components in FIG. 4.
Figure 7:
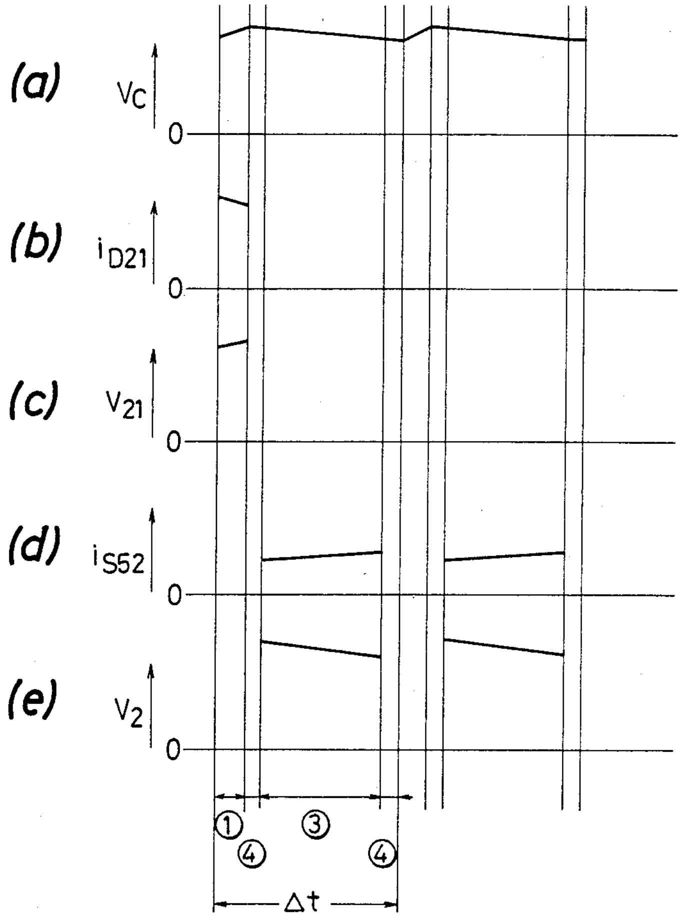
FIGS. 7(*a*)–(*e*) are waveform charts illustrating the changes in voltages or currents at various components in FIG. 4, with a control mode different from that shown in FIG. 6.

FIG. 7 illustrates an example where the on-off timing of the switches 51, 52 at preset time intervals differs from that shown in FIG. 6.

In either case, because the switches 51, 52 are controlled so that they are turned on and off at a given time intervals of a preset time Δt, no uncontrollable time factor is admitted and proper quick-response control is available.

Moreover, in view of the fact that the voltage polarity of the capacitor is constant, and because the factors setting the capacitance of the capacitor 1 are free from the influence of the energy transmitting speed etc., the shortcomings of the conventional apparatus have been eliminated.

Figure 8:
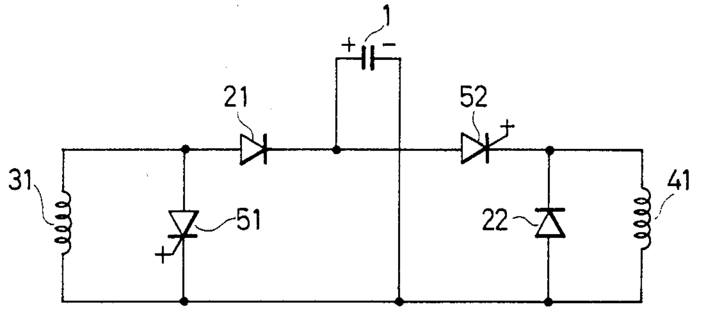
FIGS. 8–11 are circuit configurations illustrating other examples of the present invention.
Figure 9:
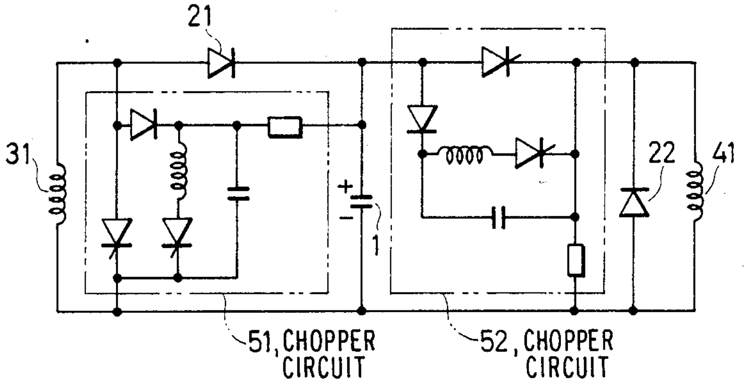
Figure 10:
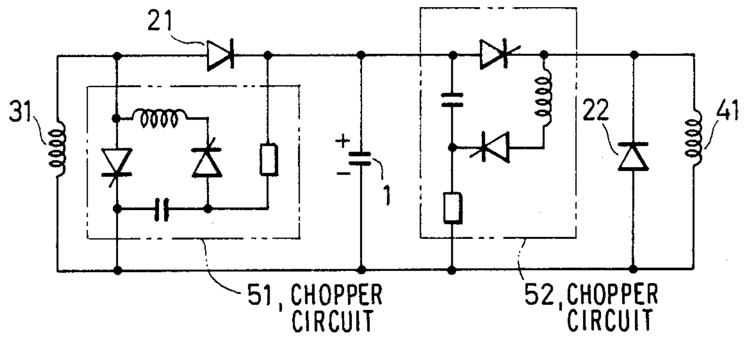

Although on-off self-controllable switches are employed as the switches 51, 52 in the above example, the same effects can be obtained even if a gate turn-off thyristor as shown in FIG. 8 or a chopper circuit equipped with a thyristor as shown in FIG. 9 or 10 are employed.

FIGS. 8, 9 and 10 illustrate gate turn-off thyristors 51, 52, and chopper circuits 51, 52 formed of thyristors, respectively.

Figure 11:
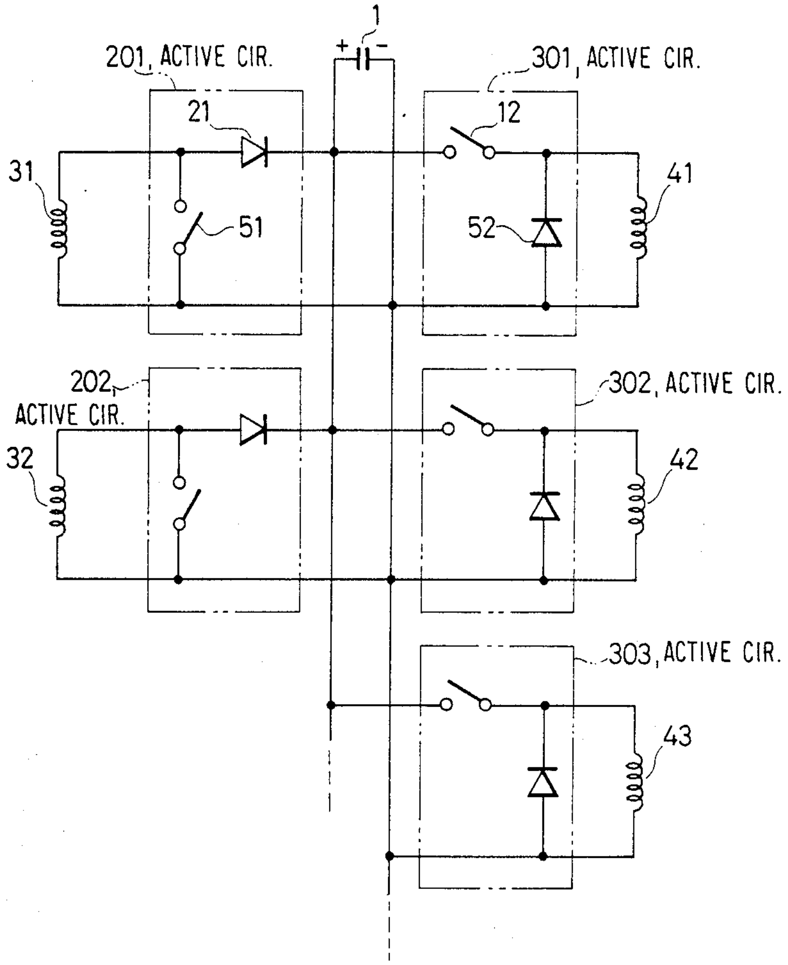

Moreover, since the capacitor voltage is controlled so as to be constant according to the present invention, it is possible to utilize a capacitor common to a plurality of coils for transmitting energy between coils, as in the case of a modified version shown in FIG. 11. As for the coil, a plurality thereof may be installed on either the releasing or absorbing side.

FIG. 11 illustrates energy releasing coils 31, 32, energy absorbing coils 41-43, and active circuits 201, 202, 301, 302, 303 for transmitting energy.

In addition, when the quantity of energy transmitted changes depending on time, the set value of the capacitor voltage may be changed according to a program.

As has been made clear, in the foregoing, according to the present invention, the apparatus becomes less costly and is permitted to transmit a greater amount of energy per unit time because the energy transmitting circuit is made up of an inexpensive unipolar capacitor and on-off self-controllable switches.

Moreover, the capacitor voltage for tranmitting energy is controlled so as to be constant; consequently, the control operation in the circuit is effectively simplified even when energy is transmitted to and from a plurality of coils.

Figure 1:
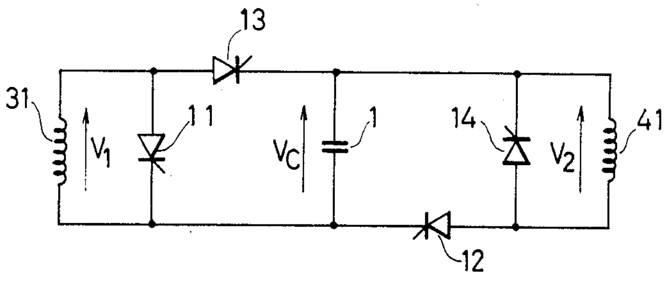
FIG. 1 PRIOR ART
FIG. 1 is a circuit configuration of a conventional energy transmitting apparatus.
Figure 2:
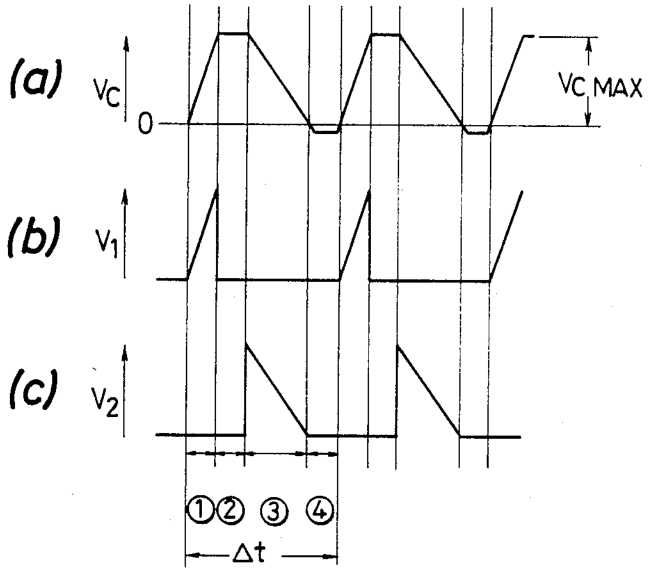
FIG. 2 PRIOR ART
FIGS. 2(*a*)–(*c*) are waveform charts illustrating the changes of voltages of various components shown in FIG. 1.
Figure 3:
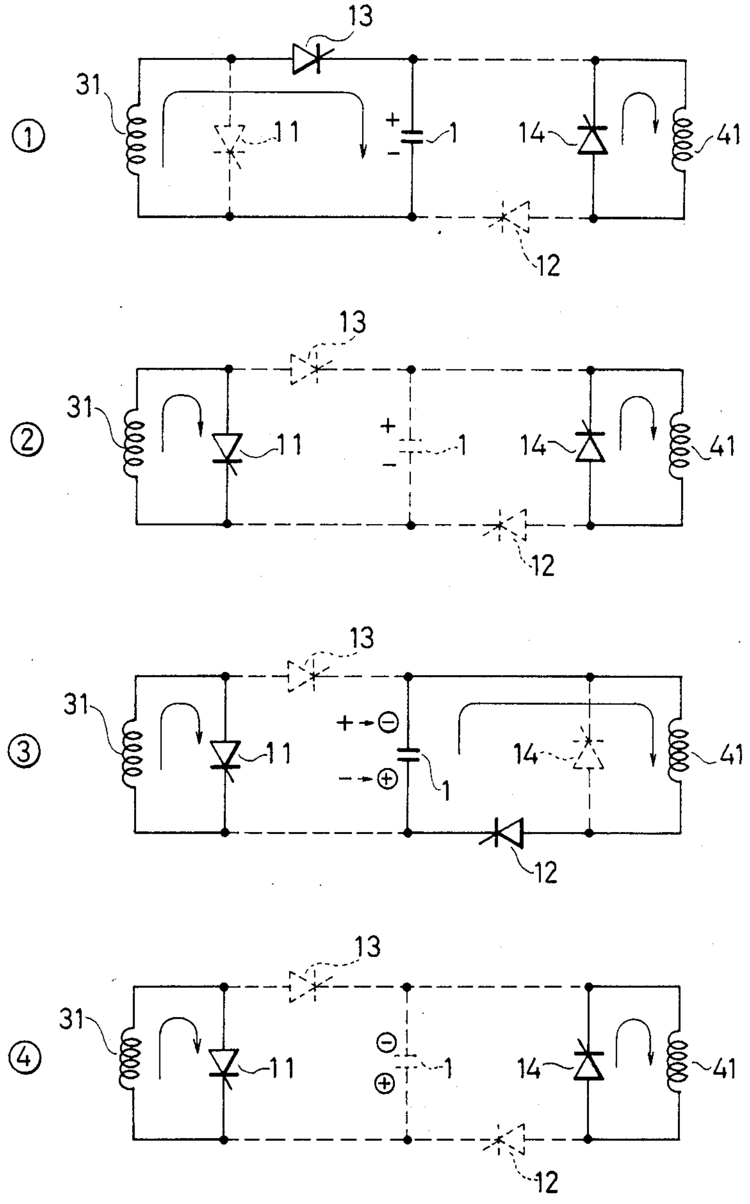
FIG. 3 PRIOR ART
FIGS. 3(1)–(4) are diagrams of operating modes explanatory of the operation of the FIG. 1 device.
Figure 12:
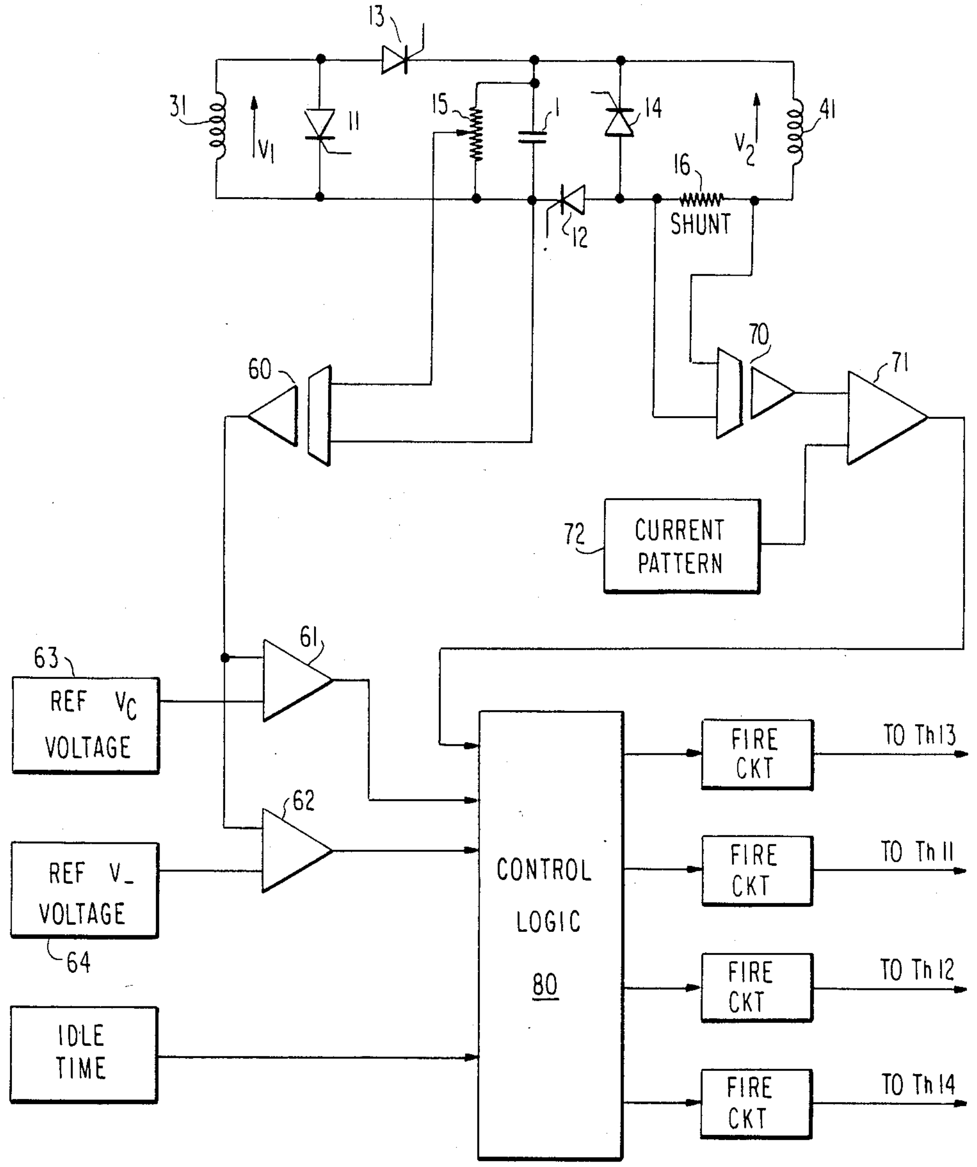
FIG. 12 PRIOR ART
FIG. 12 is an illustration of the prior art control circuit.

FIG. 12 discloses the operation of a control circuit for the prior art circuit shown in FIG. 1, and is identical to FIG. 4 discussed in the Ueda et al reference identified above. The voltage across capacitor (1) is detected at an appropriate level by modifying the setting of variable resistor (15). The monitored level of the stored voltage is amplified by amplifier (60) and forwarded to comparators (61 and 62) which have as inputs reference voltages Vc and V_. The current across shunt (16) is measured as a voltage and amplified by amplifier (70). The output of amplifier (70) is compared by comparitor (71) to a standard current pattern from generator (72) and is applied to control logic (80). The output from control logic (80) are signals selectively fed to firing circuits which control each of the thyristors (11, 12, 13 and 14). In the basic transfer mode, reference voltages Vc and V_ are fixed; idle time, which is the period between the triggering of thyristor (11) and thyristor (12), also is fixed. In a controlled transfer mode, the idle time changes while Vc and V_ remain fixed.

Figure 13:
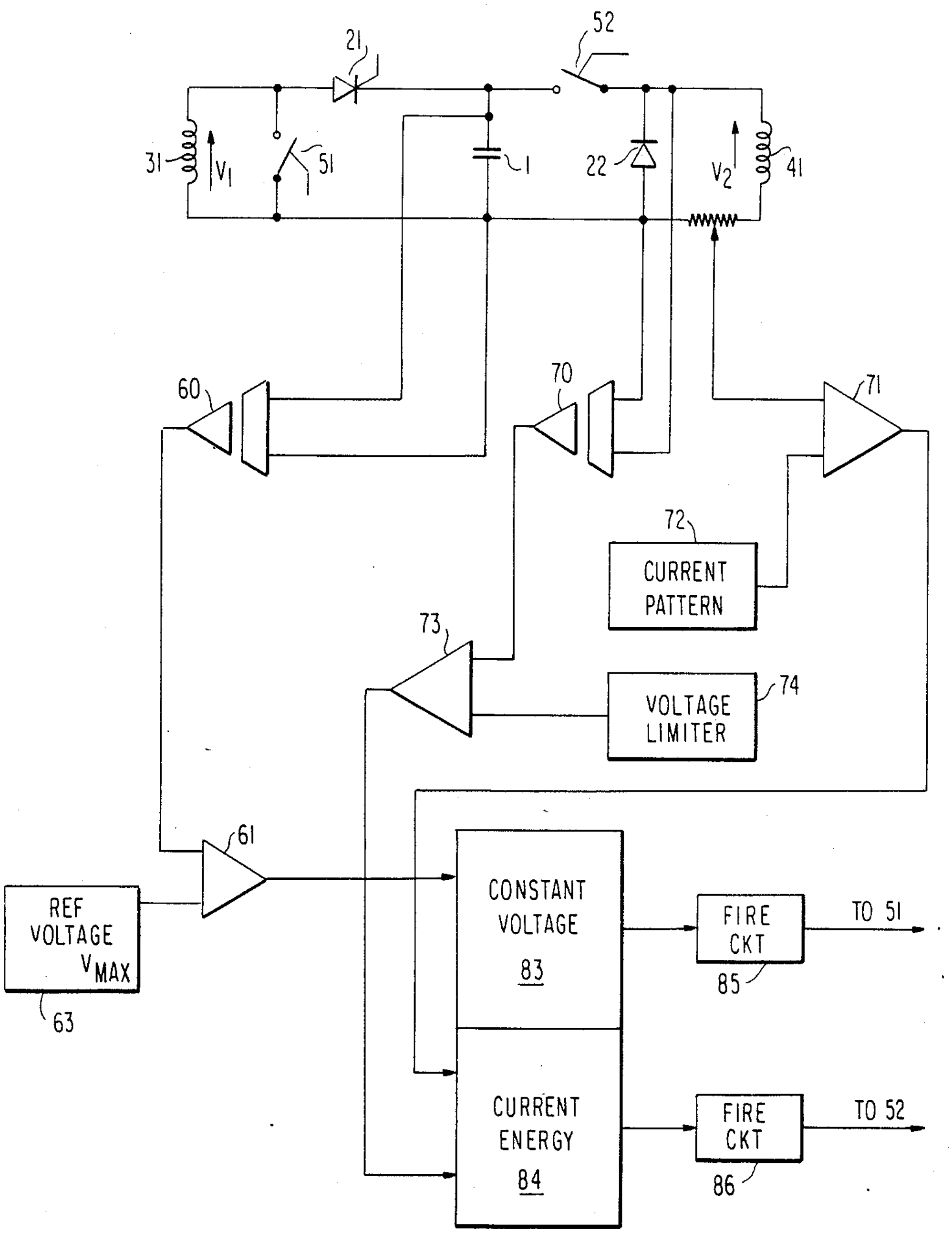
FIG. 13 is an illustration of a similar control circuit for the present invention.

Referring to FIG. 13, a control circuit, which is a variation of that shown in FIG. 12, can be seen. As noted in the specification earlier regarding the operative description of FIG. 4, the voltage across capacitor (1) will remain constant and at a constant polarity. Accordingly, amplifier (60) receives the entire voltage across the capacitor and transmits that voltage to comparator (61) which also receives an input from reference voltage source (63). Should the voltage vary, a constant voltage logic circuit (83) will cause operation of a firing circuit (85) that will operate switch (51). The control circuit (81) as shown in FIG. 4 comprises amplifier (60) and (61), reference voltage source (63), constant voltage circuit (83) and fire circuit (85). Constant voltage circuit (83) is further adapted to operate at time intervals Δt, as shown in FIGS. 6 and 7, and thereby maintain the voltage constant during the period.

Switch (52) is further controlled to operate at preset time intervals Δt to obtain from capacitor (1) energy which should be transmitted to the coil (41). The voltage across coil (41) is maintained constant by virtue of amplifier (70) which provides that voltage to comparator (73), having as a second input voltage limiter (74). The output of comparator (73) indicates to current and energy circuit (84) whether the voltage across the coil has exceeded a preset value. If so, circuit (84) causes the fire circuit (86) to operate switch (52). Further, as in the prior art circuit shown in FIG. 12, the current flowing through coil (41) is detected by comparator (71), having as a second input a current pattern generator (72). The result of this comparison is also fed to current energy circuit (84). The control circuit (82) as shown in FIG. 4 comprises comparator (71), current pattern generator (72), amplifier (70), comparator (73), voltage limiter (74), current/energy logic circuit (84) and fire circuit (86).

Further modifications of the above circuit to accommodate the various embodiments shown in the specification would be obvious to one of ordinary skill in the art.

What is claimed is:

1. An apparatus for transmitting energy to an energy absorbing superconductive coil and from an energy releasing superconductive coil through a capacitor, comprising; and energy releasing superconductive coil having one end connected to one end of said capacitor, the other end of said energy releasing coil being connected to the other end of said capacitor through a first diode, a first on-off self-controllable switch connected to said energy releasing coil in parallel, a second diode connected to said energy absorbing superconductive coil in parallel, one end of said energy absorbing coil being connected to said one end of said capacitor through a second on-off self-controllable switch and the other end of said coil being connected to the other end of said capacitor, the terminal voltage of said capacitor being controllable so as to make said voltage unipolar by controlling the on and off states of said first switch, and the terminal voltage of said energy absorbing coil being controlled according to the quantity of said energy transmitted by controlling the on an off states of said second switch.

2. An apparatus as claimed in claim 1, the terminal voltage of said capacitor being controlled so as to make said voltage constant by means of said first on-off self-controllable switch coupled to said energy releasing coil in parallel.

3. An apparatus as claimed in claim 2, wherein a plurality of at least one of energy releasing circuits, each comprising an energy releasing coil, a first switch and a first diode, or energy absorbing circuits, each comprising an energy absorbing coil, a second switch and a second diode, are connected to a capacitor common to said circuits.

4. An apparatus as claimed in claim 1, wherein said first and second on-off self-controllable switches are gate turn-off thyristors.

5. An apparatus as claimed in claim 1, wherein said first and second on-off self-controllable switches are chopper circuits comprising thyristors.

* * * * *